(12) United States Patent
Kim

(10) Patent No.: US 11,804,273 B2
(45) Date of Patent: Oct. 31, 2023

(54) MEMORY DEVICE FOR SETTING CHANNEL INITIALIZATION TIME BASED ON INHABITION COUNT VALUE AND METHOD OF THE MEMORY DEVICE

(71) Applicant: SK hynix Inc., Icheon-si (KR)

(72) Inventor: Jong Wook Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 172 days.

(21) Appl. No.: 17/385,373

(22) Filed: Jul. 26, 2021

(65) Prior Publication Data
US 2022/0270695 A1    Aug. 25, 2022

(30) Foreign Application Priority Data
Feb. 22, 2021    (KR) .......................... 10-2021-0023623

(51) Int. Cl.
*G11C 16/20*    (2006.01)
*G11C 16/34*    (2006.01)
*G11C 16/26*    (2006.01)
*G11C 16/14*    (2006.01)
*G11C 16/10*    (2006.01)

(52) U.S. Cl.
CPC ........ *G11C 16/3459* (2013.01); *G11C 16/102* (2013.01); *G11C 16/14* (2013.01); *G11C 16/20* (2013.01); *G11C 16/26* (2013.01)

(58) Field of Classification Search
CPC ................ G11C 16/0483; G11C 16/32; G11C 16/102; G11C 16/14; G11C 16/20; G11C 16/26; G11C 16/3459
See application file for complete search history.

(56) References Cited

U.S. PATENT DOCUMENTS

2020/0020406 A1*  1/2020  Kim ................. G11C 16/08
2020/0133572 A1*  4/2020  Park ................ G06F 3/0632

FOREIGN PATENT DOCUMENTS

KR    1020200008436 A    1/2020
KR    1020200048315 A    5/2020

\* cited by examiner

*Primary Examiner* — Alfredo Bermudez Lozada
(74) *Attorney, Agent, or Firm* — William Park & Associates Ltd.

(57) ABSTRACT

Provided herein is a memory device and a method of operating the same. The memory device includes a plurality of memory blocks, each including a plurality of memory cells, and a peripheral circuit configured to perform program operations, read operations and erase operations on the plurality of memory blocks. The memory device also includes control logic configured to, when the read operation is performed on any one of the plurality of memory blocks, set a channel initialization time used to initialize channels of memory cells included in the one memory block based on an inhibition count value indicating a number of times that a corresponding operation is inhibited from being performed on the one memory block, and control the peripheral circuit so that the channels are initialized during the channel initialization time before the read operation is performed.

20 Claims, 18 Drawing Sheets

FIG. 4

|  | 1 | 2 | 3 | 4 | 5 | 6 |
|---|---|---|---|---|---|---|
| BLK1 | PGM | INHIBIT | READ | INHIBIT | ERASE | INHIBIT |
| BLK2 | INHIBIT | PGM | INHIBIT | INHIBIT | INHIBIT | INHIBIT |
| BLK3 | INHIBIT | INHIBIT | INHIBIT | PGM | INHIBIT | READ |
| BLK4 | INHIBIT | INHIBIT | INHIBIT | INHIBIT | INHIBIT | INHIBIT |
| BLK5 | INHIBIT | INHIBIT | INHIBIT | INHIBIT | INHIBIT | INHIBIT |
| BLK6 | INHIBIT | INHIBIT | INHIBIT | INHIBIT | INHIBIT | INHIBIT |

FIG. 6

|  | PGM_INH_CNT | READ_INH_CNT | ERASE_INH_CNT |
|---|---|---|---|
| BLK1 | – | – | – |
| BLK2 | 1 (+1) | – | – |
| BLK3 | 1 (+1) | – | – |
| BLK4 | 1 (+1) | – | – |
| BLK5 | 1 (+1) | – | – |
| BLK6 | 1 (+1) | – | – |

FIG. 7

|      | PGM_INH_CNT | READ_INH_CNT | ERASE_INH_CNT |
|------|-------------|--------------|---------------|
| BLK1 | 1 (+1)      | —            | —             |
| BLK2 | 1           | —            | —             |
| BLK3 | 2 (+1)      | —            | —             |
| BLK4 | 2 (+1)      | —            | —             |
| BLK5 | 2 (+1)      | —            | —             |
| BLK6 | 2 (+1)      | —            | —             |

FIG. 8

|      | PGM_INH_CNT | READ_INH_CNT | ERASE_INH_CNT |
|------|-------------|--------------|---------------|
| BLK1 | 1           | –            | –             |
| BLK2 | 1           | 1 (+1)       | –             |
| BLK3 | 2           | 1 (+1)       | –             |
| BLK4 | 2           | 1 (+1)       | –             |
| BLK5 | 2           | 1 (+1)       | –             |
| BLK6 | 2           | 1 (+1)       | –             |

FIG. 9

|      | PGM_INH_CNT | READ_INH_CNT | ERASE_INH_CNT |
|------|-------------|--------------|---------------|
| BLK1 | 2 (+1)      | –            | –             |
| BLK2 | 2 (+1)      | 1            | –             |
| BLK3 | 2           | 1            | –             |
| BLK4 | 3 (+1)      | 1            | –             |
| BLK5 | 3 (+1)      | 1            | –             |
| BLK6 | 3 (+1)      | 1            | –             |

FIG. 10

|       | PGM_INH_CNT | READ_INH_CNT | ERASE_INH_CNT |
|-------|-------------|--------------|---------------|
| BLK1  | 2           | –            | –             |
| BLK2  | 2           | 1            | 1 (+1)        |
| BLK3  | 2           | 1            | 1 (+1)        |
| BLK4  | 3           | 1            | 1 (+1)        |
| BLK5  | 3           | 1            | 1 (+1)        |
| BLK6  | 3           | 1            | 1 (+1)        |

FIG. 11

|  | PGM_INH_CNT | READ_INH_CNT | ERASE_INH_CNT |
|---|---|---|---|
| BLK1 | 2 | 1 (+1) | - |
| BLK2 | 2 | 2 (+1) | 1 |
| BLK3 | 2 | 1 | 1 |
| BLK4 | 3 | 2 (+1) | 1 |
| BLK5 | 3 | 2 (+1) | 1 |
| BLK6 | 3 | 2 (+1) | 1 |

FIG. 12A

|  | PGM_INH_CNT (0.6) | READ_INH_CNT (0.2) | ERASE_INH_CNT (0.2) | INH_FI | CINI_TIME |
|---|---|---|---|---|---|
| BLK1 | 300 | 300 | 50 | 250 | 3.33 |
| BLK2 | 200 | 200 | 100 | 180 | 2.4 |
| BLK3 | 300 | 100 | 1000 | 400 | 5.33 |
| BLK4 | 500 | 500 | 10 | 402 | 5.36 |
| BLK5 | 1000 | 1000 | 30 | 806 | 10.74 |
| BLK6 | 400 | 300 | 100 | 320 | 4.27 |

FIG. 12B

|  | PGM_INH_CNT (0.2) | READ_INH_CNT (0.2) | ERASE_INH_CNT (0.6) | INH_FI | CINI_TIME |
|---|---|---|---|---|---|
| BLK1 | 300 | 300 | 50 | 150 | 2 |
| BLK2 | 200 | 200 | 100 | 140 | 1.87 |
| BLK3 | 300 | 100 | 1000 | 680 | 9.07 |
| BLK4 | 500 | 500 | 10 | 206 | 2.74 |
| BLK5 | 1000 | 1000 | 30 | 418 | 5.73 |
| BLK6 | 400 | 300 | 100 | 200 | 2.67 |

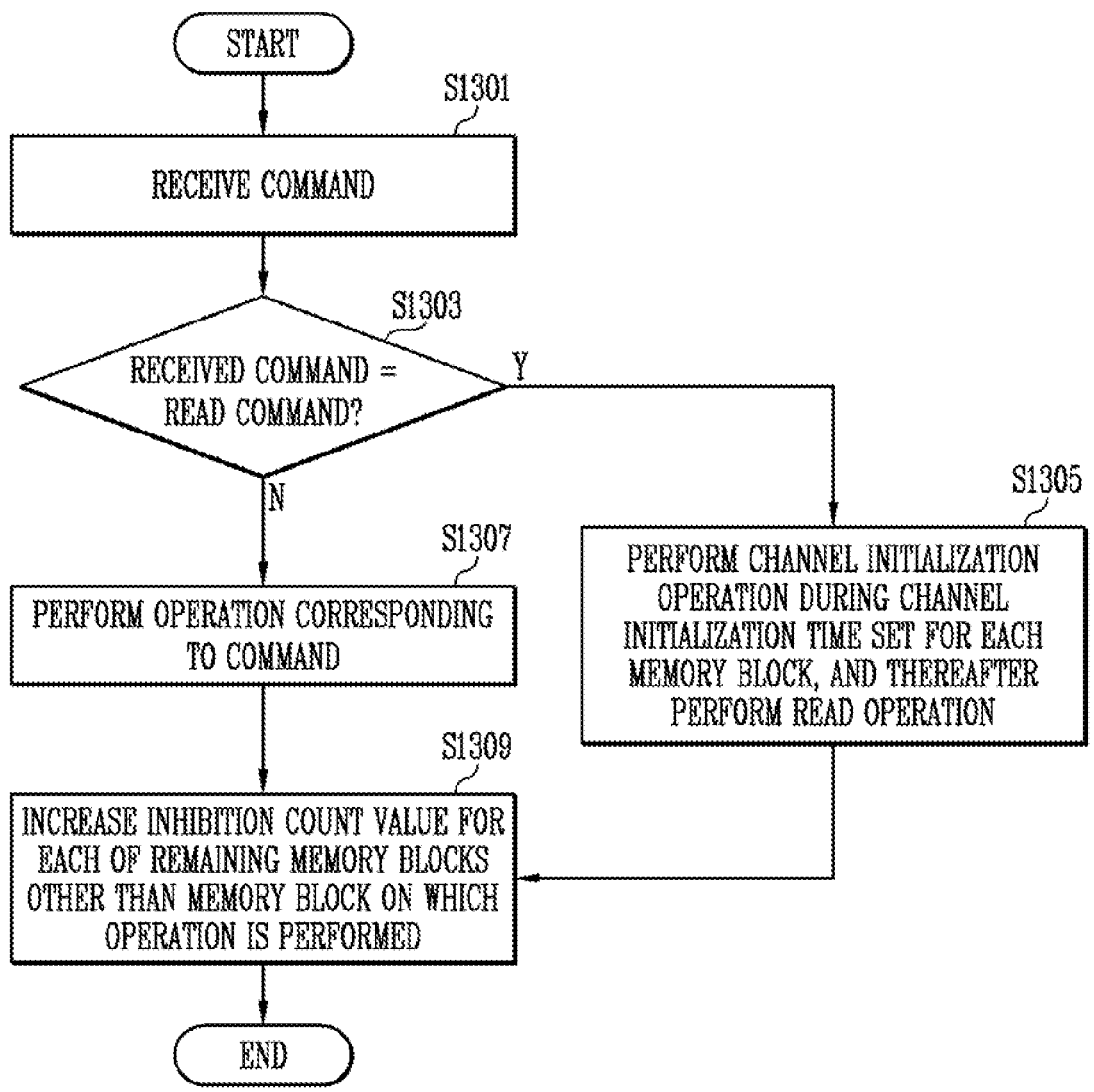

MEMORY DEVICE FOR SETTING CHANNEL INITIALIZATION TIME BASED ON INHABITION COUNT VALUE AND METHOD OF THE MEMORY DEVICE

CROSS-REFERENCE TO RELATED APPLICATION

The present application claims priority under 35 U.S.C. § 119(a) to Korean patent application number 10-2021-0023623 filed on Feb. 22, 2021, in the Korean Intellectual Property Office, the entire disclosure of which is incorporated by reference herein.

BACKGROUND

1. Technical Field

Various embodiments of the present disclosure generally relate to an electronic device, and more particularly, to a memory device and a method of operating the memory device.

2. Related Art

A storage device is a device which stores data under the control of a host device such as a computer, a smartphone, or a smartpad. Examples of a storage device include a hard disk drive (HDD), which stores data on a magnetic disk, and a solid state drive (SSD) or a memory card, which store data in semiconductor memory, particularly, nonvolatile memory, according to the device in which data is stored.

A storage device may include a memory device in which data is stored and a memory controller which controls the storage of the data in the memory device. Such memory devices may use memory classified as volatile memory or nonvolatile memory. Representative examples of the nonvolatile memory include read only memory (ROM), programmable ROM (PROM), electrically programmable ROM (EPROM), electrically erasable programmable ROM (EEPROM), flash memory, phase-change random access memory (PRAM), magnetic RAM (MRAM), resistive RAM (RRAM), and ferroelectric RAM (FRAM).

SUMMARY

Various embodiments of the present disclosure are directed to a memory device, which improves read performance by setting a channel initialization time depending on the number of times that a corresponding operation is inhibited for each memory block of the memory device, and a method of operating the memory device.

An embodiment of the present disclosure may provide for a memory device including a plurality of memory blocks, each including a plurality of memory cells, and a peripheral circuit configured to perform program operations, read operations and erase operations on the plurality of memory blocks. The memory device also includes control logic configured to, when the read operation is performed on any one of the plurality of memory blocks, set a channel initialization time used to initialize channels of memory cells included in the one memory block based on an inhibition count value indicating a number of times that a corresponding operation is inhibited from being performed on the one memory block, and control the peripheral circuit so that the channels are initialized during the channel initialization time before the read operation is performed.

An embodiment of the present disclosure may provide for a method of operating a memory device including a plurality of memory blocks each including a plurality of memory cells. The method includes, before a read operation is performed on any one of the plurality of memory blocks, counting a number of times that a corresponding operation is inhibited from being performed on the one memory block and then generating an inhibition count value. The method also includes determining a final inhibition count value based on the inhibition count value, setting a channel initialization time used to initialize channels of memory cells included in the one memory block based on the final inhibition count value, and initializing the channels during the channel initialization time, and thereafter performing the read operation.

BRIEF DESCRIPTION OF THE DRAWINGS

FIG. 4 is a table illustrating operations performed on memory blocks and operations inhibited from being performed thereon.

FIGS. 6 to 11 illustrate count values stored in an inhibition count table depending on the operation of FIG. 4.

FIGS. 12A and 12B illustrate tables of final inhibition count values, determined based on weights, and channel initialization times.

FIG. 13 is a flowchart illustrating the operation of a memory device according to an embodiment of the present disclosure.

DETAILED DESCRIPTION

Specific structural or functional descriptions of presented embodiments in the present disclosure are introduced as examples. These descriptions should not be construed as governing or limiting all possible embodiments of the present teachings.

Figure 1:
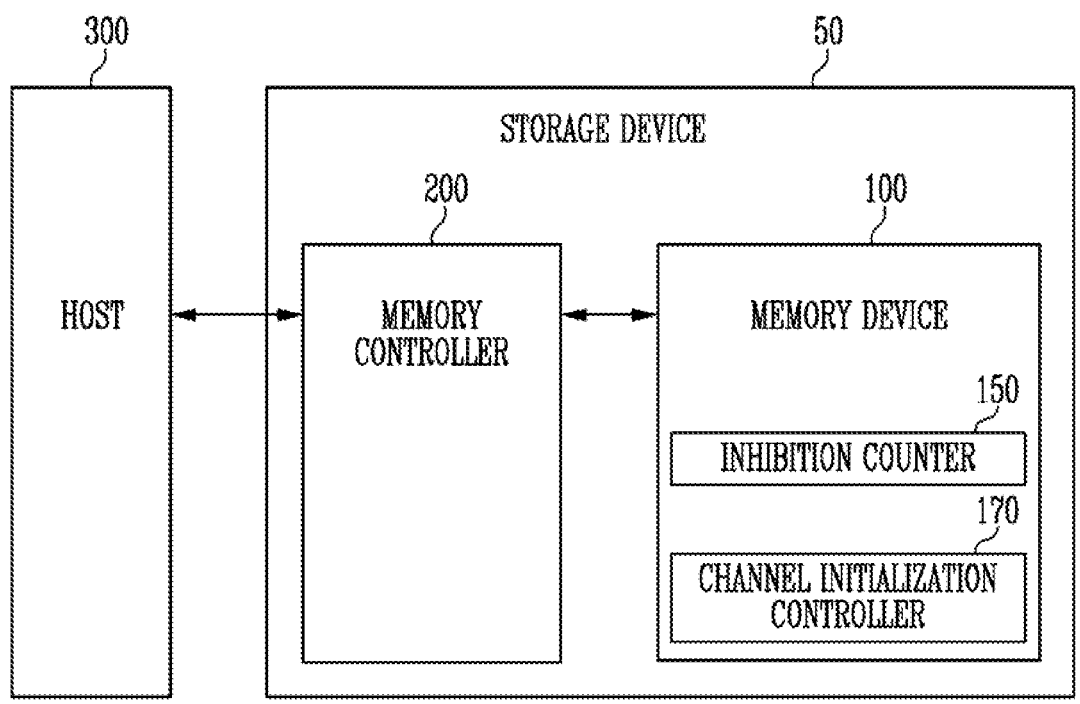
FIG. 1 is a block diagram illustrating a storage device.

FIG. 1 is a block diagram illustrating a storage device.

Referring to FIG. 1, a storage device 50 may include memory device 100 and a memory controller 200.

The storage device 50 may be a device which stores data under the control of a host 300, such as a mobile phone, a smartphone, an MP3 player, a laptop computer, a desktop computer, a game console, a television (TV), a tablet PC, or an in-vehicle infotainment system.

The storage device 50 may be manufactured as any one of various types of storage devices depending on a host interface that is a scheme for communication with the host 300. For example, the storage device 50 may be implemented as any one of various types of storage devices, for example, a solid state disk (SSD), a multimedia card such as an MMC, an embedded MMC (eMMC), a reduced size MMC (RS-MMC), or a micro-MMC, a secure digital card such as an SD, a mini-SD, or a micro-SD, a universal serial bus (USB) storage device, a universal flash storage (UFS) device, a personal computer memory card international association (PCMCIA) card-type storage device, a peripheral component interconnection (PCI)-card type storage device, a PCI express (PCI-E) card-type storage device, a compact flash (CF) card, a smart media card, and a memory stick.

The storage device 50 may be manufactured in any one of various types of package forms. For example, the storage device 50 may be manufactured in any one of various types of package forms, such as package on package (POP), system in package (SIP), system on chip (SOC), multi-chip package (MCP), chip on board (COB), wafer-level fabricated package (WFP), and wafer-level stack package (WSP).

The memory device 100 may store data. The memory device 100 is operated in response to the control of the memory controller 200. The memory device 100 may include a memory cell array including a plurality of memory cells which store data. The memory cell array may include a plurality of memory blocks. Each memory block may include a plurality of memory cells, which may constitute a plurality of pages. In an embodiment, each page may be a unit by which data is stored in the memory device 100 or by which data stored in the memory device 100 is read. A memory block may be a unit by which data is erased.

In an embodiment, the memory device 100 may include memory in many alternative forms, such as double data rate synchronous dynamic random access memory (DDR SDRAM), low power double data rate fourth generation (LPDDR4) SDRAM, graphics double data rate (GDDR) SDRAM, low power DDR (LPDDR) SDRAM, Rambus dynamic random access memory (RDRAM), NAND flash memory, vertical NAND flash memory, NOR flash memory device, resistive RAM (RRAM), phase-change RAM (PRAM), magnetoresistive RAM (MRAM), ferroelectric RAM (FRAM), or spin transfer torque RAM (STT-RAM). In the present specification, for convenience of description, a description will be made on the assumption that the memory device 100 is a NAND flash memory device including NAND flash memory.

The memory device 100 may be implemented in a two-dimensional (2D) array structure or a three-dimensional (3D) array structure. Hereinafter, although a 3D array structure is described as an embodiment, the present disclosure is not limited to the 3D array structure. The present disclosure may also be applied not only to a flash memory device in which a charge storage layer is formed of a conductive floating gate (FG), but also to a charge trap flash (CTF) memory device in which a charge storage layer is formed of an insulating layer.

In an embodiment, the memory device 100 may be operated in a single-level cell (SLC) manner in which one data bit is stored in one memory cell. Alternatively, the memory device 100 may be operated in a manner in which at least two data bits are stored in one memory cell. For example, the memory device 100 may be operated in a multi-level cell (MLC) manner in which two data bits are stored in one memory cell, a triple-level cell (TLC) manner in which three data bits are stored in one memory cell, or a quadruple-level cell (QLC) manner in which four data bits are stored in one memory cell.

The memory device 100 may receive a command and an address from the memory controller 200, and may access the area of the memory cell array, selected by the address. That is, the memory device 100 may perform an operation corresponding to the command on the area selected by the address. For example, the memory device 100 may perform a write operation (i.e., program operation), a read operation or an erase operation in response to the received command. When a program command is received, the memory device 100 may program data to the area selected by the address. When a read command is received, the memory device 100 may read data from the area selected by the address. When an erase command is received, the memory device 100 may erase data stored in the area selected by the address.

In an embodiment, the memory device 100 may perform a program operation, a read operation, or an erase operation. Here, the memory device 100 may apply voltages to a source line and a bit line, among lines coupled to a memory block, depending on the operation that is performed on the memory block. Here, among the lines coupled to the memory block, word lines may float, but a potential difference between the word lines may occur depending on the voltages applied to the source line and the bit line.

When the potential difference between the word lines occurs, band to band tunneling may occur in the channels of memory cells, and holes may flow into the channels. Also, depending on the operation that is performed on the memory block or the operation that is inhibited from being performed on the memory block, holes may flow into the channels. Therefore, because threshold voltage distributions of memory cells may change during a first read operation of the memory device 100, the memory device 100 needs to perform a channel initialization operation for discharging charges in the channels before the first read operation is performed.

However, as the channel initialization time increases, time consumed by the read operation increases, thus consequently the read performance may be deteriorated. Therefore, the present disclosure presents a method of setting a channel initialization time depending on the operation that is performed on the memory block or the operation that is inhibited from being performed on the memory block.

In an embodiment, the memory device 100 may include an inhibition counter 150. The inhibition counter 150 may count the number of times that an operation is inhibited from being performed on each memory block.

For example, when a program operation, a read operation or an erase operation is performed on any one of a plurality of memory blocks, the corresponding operation might not be performed on the remaining blocks. Here, the inhibition counter 150 may increase an inhibition count value corresponding to each of the remaining memory blocks other than the memory block on which the operation is performed.

Further, the inhibition counter 150 may increase an inhibition count value depending on the operation performed on any one of the plurality of memory blocks. For example, when a program operation is performed on any one of the plurality of memory blocks, a program inhibition count value corresponding to each of the remaining memory blocks on which the program operation is not performed may be increased.

Similarly, when a read operation or an erase operation is performed on any one of the plurality of memory blocks, a read inhibition count value or an erase inhibition count value corresponding to each of the remaining memory blocks on which the operation is not performed may be increased.

In an embodiment, the memory device 100 may include a channel initialization controller 170. The channel initialization controller 170 may control a channel initialization time for each memory block.

In detail, the channel initialization controller 170 may set the channel initialization time based on a final inhibition count value in which a weight is assigned to the inhibition count value counted by the inhibition counter 150. For example, depending on whether the inhibited operation is a program operation, a read operation or an erase operation, the weight may be set for the inhibition count value, and then the final inhibition count value may be determined. When the final inhibition count value is determined, the channel initialization controller 170 may set a channel initialization time corresponding to the final inhibition count value.

The memory controller 200 may control the overall operation of the storage device 50.

When a supply voltage is applied to the storage device 50, the memory controller 200 may run firmware. When the memory device 100 is a flash memory device 100, the memory controller 200 may run firmware such as a Flash Translation Layer (FTL) for controlling communication between the host 300 and the memory device 100.

In an embodiment, the memory controller 200 may include firmware (not illustrated) which may receive data and a logical block address (LBA) from the host 300, and may translate the logical block address (LBA) into a physical block address (PBA) indicating the address of memory cells which are included in the memory device 100 and in which data is to be stored. Further, the memory controller 200 may store a logical-physical address mapping table, which configures mapping relationships between logical block addresses (LBA) and physical block addresses (PBA), in a buffer memory (not illustrated).

The memory controller 200 may control the memory device 100 so that a program operation, a read operation or an erase operation is performed in response to a request received from the host 300. For example, when a program request is received from the host 300, the memory controller 200 may convert the program request into a program command, and may provide the program command, a physical block address (PBA), and data to the memory device 100. When a read request together with a logical block address is received from the host 300, the memory controller 200 may convert the read request into a read command, select a physical block address corresponding to the logical block address, and thereafter provide the read command and the physical block address (PBA) to the memory device 100. When an erase request together with a logical block address is received from the host 300, the memory controller 200 may convert the erase request into an erase command, select a physical block address corresponding to the logical block address, and thereafter provide the erase command and the physical block address (PBA) to the memory device 100.

In an embodiment, the memory controller 200 may autonomously generate a program command, an address, and data without receiving a request from the host 300, and may transmit them to the memory device 100. For example, the memory controller 200 may provide commands, addresses, and data to the memory device 100 so as to perform background operations, such as a program operation for wear leveling and a program operation for garbage collection.

In an embodiment, the memory controller 200 may control at least two memory devices. In this case, the memory controller 200 may control the memory devices depending on an interleaving scheme to improve operating performance.

The host 300 may communicate with the storage device 50 using at least one of various communication methods, such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
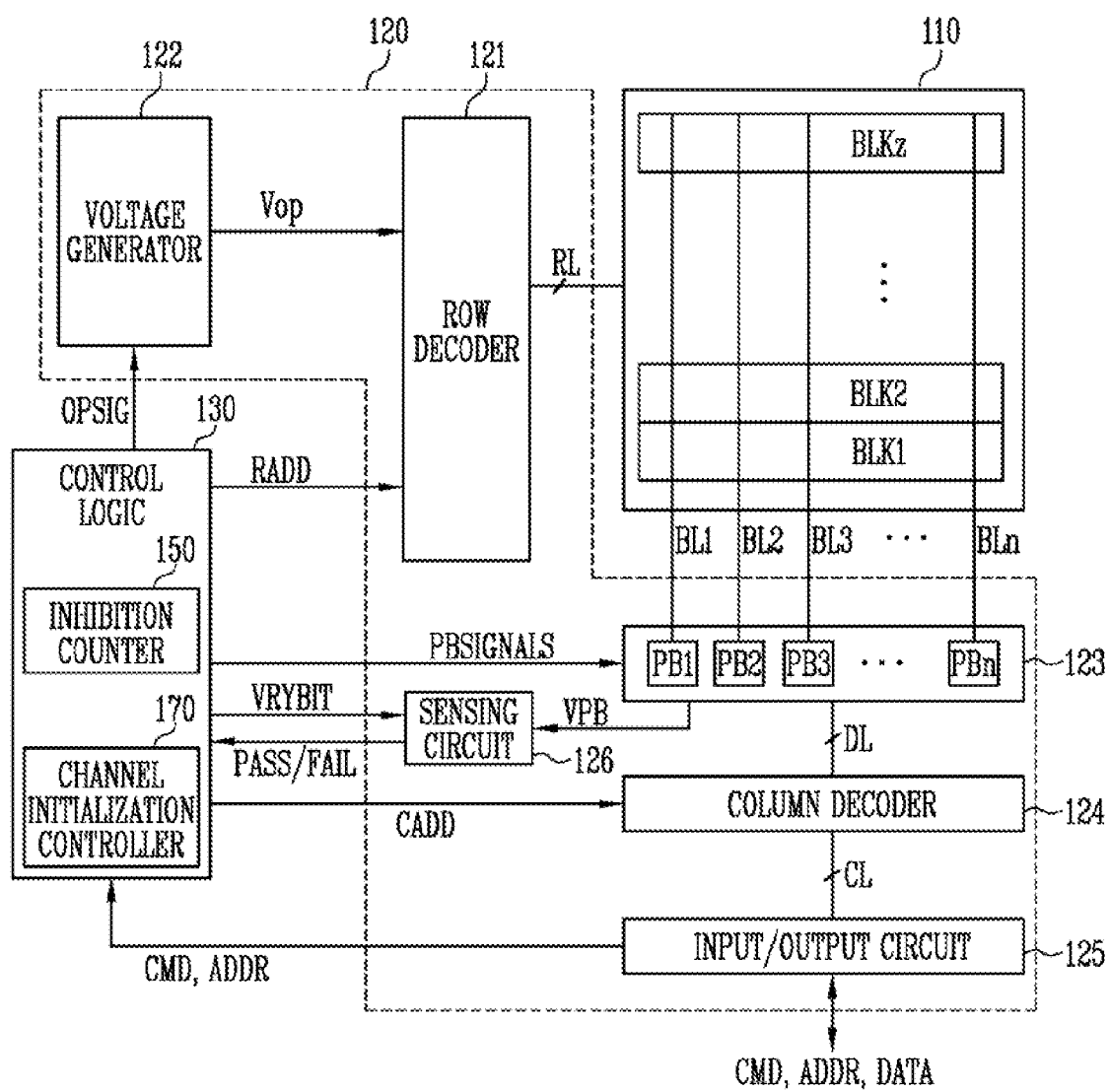
FIG. 2 is a diagram illustrating the structure of a memory device of FIG. 1.

FIG. 2 is a diagram illustrating the structure of the memory device of FIG. 1.

Referring to FIG. 2, the memory device 100 may include a memory cell array 110, a peripheral circuit 120, and control logic 130.

The memory cell array 110 includes a plurality of memory blocks BLK1 to BLKz. The plurality of memory blocks BLK1 to BLKz are coupled to a row decoder 121 through row lines RL. Each of the memory blocks BLK1 to BLKz may be coupled to a page buffer group 123 through bit lines BL1 to BLn. Each of the memory blocks BLK1 to BLKz may include a plurality of memory cells. In an embodiment, the plurality of memory cells may be nonvolatile memory cells. Memory cells coupled to the same word line may be defined as a single page. Therefore, a single memory block may include a plurality of pages.

The row lines RL may include at least one source select line, a plurality of word lines, and at least one drain select line.

Each of the memory cells included in the memory cell array 110 may be implemented as a single-level cell (SLC) capable of storing one data bit, a multi-level cell (MLC) capable of storing two data bits, a triple-level cell (TLC) capable of storing three data bits, or a quadruple-level cell (QLC) capable of storing four data bits.

The peripheral circuit 120 may perform a program operation, a read operation, or an erase operation on a selected area of the memory cell array 110 under the control of the control logic 130. The peripheral circuit 120 may drive the memory cell array 110. For example, the peripheral circuit 120 may apply various operating voltages to the row lines RL and the bit lines BL1 to BLn or discharge the applied voltages under the control of the control logic 130.

The peripheral circuit 120 may include the row decoder 121, a voltage generator 122, the page buffer group 123, a column decoder 124, an input/output circuit 125, and a sensing circuit 126.

The row decoder 121 is coupled to the memory cell array 110 through the row lines RL. The row lines RL may include the at least one source select line, the plurality of word lines, and the at least one drain select line. In an embodiment, the word lines may include normal word lines and dummy word lines. In an embodiment, the row lines RL may further include a pipe select line.

The row decoder 121 may decode a row address RADD received from the control logic 130. The row decoder 121 selects at least one of the memory blocks BLK1 to BLKz according to the decoded address. Further, the row decoder 121 may select at least one word line WL of the selected memory block so that voltages generated by the voltage generator 122 are applied to the at least one word line WL according to the decoded address.

For example, during a program operation, the row decoder 121 may apply a program voltage to a selected word line and apply a program pass voltage having a level lower than that of the program voltage to unselected word lines. During a program verify operation, the row decoder 121 may apply a verify voltage to a selected word line and apply a verify pass voltage higher than the verify voltage to unselected word lines. During a read operation, the row decoder 121 may apply a read voltage to a selected word line and apply a read pass voltage higher than the read voltage to unselected word lines.

In an embodiment, the erase operation of the memory device 100 is performed on a memory block basis. During an erase operation, the row decoder 121 may select one memory block according to the decoded address. During the erase operation, the row decoder 121 may apply a ground voltage to word lines coupled to the selected memory block.

The voltage generator 122 may be operated under the control of the control logic 130. The voltage generator 122 may generate a plurality of voltages using an external supply voltage provided to the memory device 100. In detail, the voltage generator 122 may generate various operating voltages Vop that are used for program, read, and erase operations in response to an operation signal OPSIG. For example, the voltage generator 122 may generate a program voltage, a verify voltage, a pass voltages, a read voltage, an erase voltage, etc. under the control of the control logic 130.

In an embodiment, the voltage generator 122 may generate an internal supply voltage by regulating the external supply voltage. The internal supply voltage generated by the voltage generator 122 is used as an operating voltage for the memory device 100.

In an embodiment, the voltage generator 122 may generate a plurality of voltages using the external supply voltage or the internal supply voltage.

For example, the voltage generator 122 may include a plurality of pumping capacitors for receiving the internal supply voltage and generate a plurality of voltages by selectively enabling the plurality of pumping capacitors under the control of the control logic 130.

The generated voltages may be supplied to the memory cell array 110 by the row decoder 121.

The page buffer group 123 includes first to nth page buffers PB1 to PBn. The first to nth page buffers PB1 to PBn are coupled to the memory cell array 110 through the first to nth bit lines BL1 to BLn. The first to nth page buffers PB1 to PBn are operated under the control of the control logic 130. In detail, the first to nth page buffers PB1 to PBn may be operated in response to page buffer control signals PBSIGNALS. For example, the first to nth page buffers PB1 to PBn may temporarily store data received through the first to nth bit lines BL1 to BLn or may sense voltages or currents of the bit lines BL1 to BLn during a read or verify operation.

In detail, during a program operation, when the program voltage is applied to the selected word line, the first to nth page buffers PB1 to PBn may transfer the data DATA, received through the input/output circuit 125, to selected memory cells through the first to nth bit lines BL1 to BLn. The memory cells in the selected page are programmed based on the received data DATA. During a program verify operation, the first to nth page buffers PB1 to PBn may read page data by sensing the voltages or currents received through the first to nth bit lines BL1 to BLn from the selected memory cells.

During a read operation, the first to nth page buffers PB1 to PBn may read data DATA from the memory cells in the selected page through the first to nth bit lines BL1 to BLn, and may output the read data DATA to the input/output circuit 125 under the control of the column decoder 124.

During the erase operation, the first to nth page buffers PB1 to PBn may allow the first to nth bit lines BL1 to BLn to float or may apply the erase voltage to the first to nth bit lines BL1 to BLn.

The column decoder 124 may transfer data between the input/output circuit 125 and the page buffer group 123 in response to a column address CADD. For example, the column decoder 124 may exchange data with the first to nth page buffers PB1 to PBn through data lines DL or may exchange data with the input/output circuit 125 through column lines CL.

The input/output circuit 125 may transfer a command CMD and an address ADDR, received from the memory controller (e.g., 200 of FIG. 1) described above with reference to FIG. 1, to the control logic 130, or may exchange data DATA with the column decoder 124.

During a read operation or a verify operation, the sensing circuit 126 may generate a reference current in response to an enable bit VRYBIT, and may compare a sensing voltage VPB received from the page buffer group 123 with a reference voltage generated by the reference current and then output a pass signal PASS or a fail signal FAIL.

The control logic 130 may control the peripheral circuit 120 by outputting the operation signal OPSIG, the row address RADD, the page buffer control signals PBSIGNALS, and the enable bit VRYBIT in response to the command CMD and the address ADDR. For example, the control logic 130 may control a read operation on a selected memory block in response to a sub-block read command and an address. Also, the control logic 130 may control an erase operation on a selected sub-block included in a selected memory block in response to a sub-block erase command and an address. In addition, the control logic 130 may determine whether a verify operation has passed or failed in response to the pass or fail signal PASS or FAIL. The control logic 130 may be implemented as hardware, software, or a combination of hardware and software. For example, the control logic 130 may be a control logic circuit operating in accordance with an algorithm and/or a processor executing control logic code.

Figure 3:
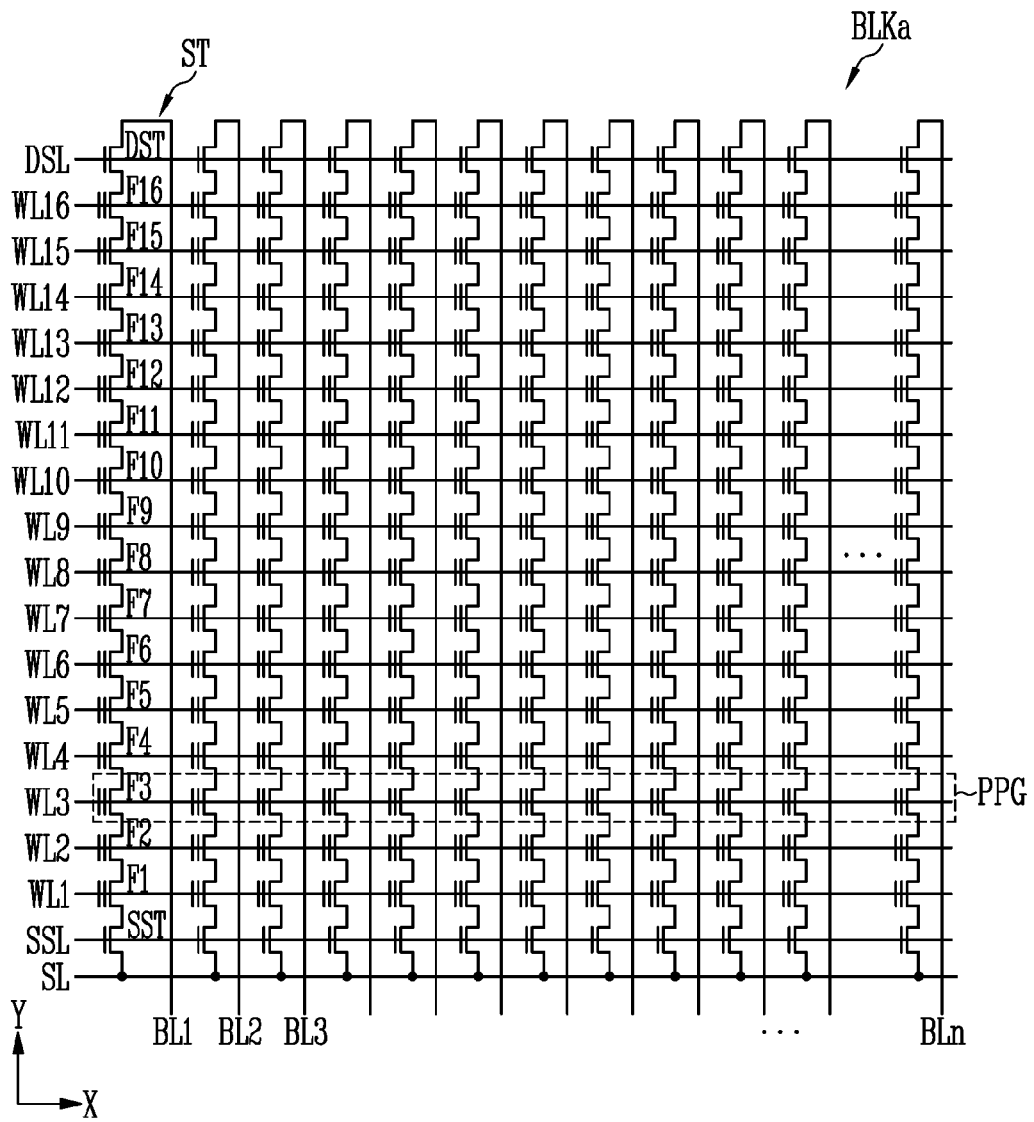
FIG. 3 is a diagram illustrating an embodiment of a memory cell array of FIG. 2.

FIG. 3 is a diagram illustrating an embodiment of the memory cell array of FIG. 2.

Referring to FIGS. 2 and 3, FIG. 3 is a circuit diagram illustrating any one memory block BLKa of a plurality of memory blocks BLK1 to BLKz included in the memory cell array 110 of FIG. 2.

The memory block BLKa may be coupled to a first select line, word lines, and a second select line that are coupled in parallel to each other. For example, the word lines may be coupled in parallel to each other between the first and second select lines. Here, the first select line may be a source select line SSL, and the second select line may be a drain select line DSL.

In detail, the memory block BLKa may include a plurality of strings coupled between bit lines BL1 to BLn and a source line SL. The bit lines BL1 to BLn may be coupled to the strings, respectively, and the source line SL may be coupled in common to the strings. Because the strings may be equally configured, a string ST coupled to the first bit line BL1 will be described in detail by way of example.

The string ST may include a source select transistor SST, a plurality of memory cells F1 to F16, and a drain select transistor DST which are coupled in series to each other between the source line SL and the first bit line BL1. A single string ST may include at least one source select transistor SST and at least one drain select transistor DST, and more memory cells than the memory cells F1 to F16 illustrated in the drawing may be included in the string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors included in different strings ST may be coupled to the source select line SSL, gates of the drain select transistors included in different strings ST may be coupled to the drain select line DSL, and gates of the memory cells F1 to F16 may be coupled to a plurality of word lines WL1 to WL16, respectively. A group of memory cells coupled to the same word line, among the memory cells included in different strings ST, may be referred to as a "physical page: PPG". Therefore, the memory block BLKa may include a number of physical pages PPG identical to the number of word lines WL1 to WL16.

One memory cell may store one bit of data. This cell is typically designated as a "single-level cell: SLC". Here, one physical page PPG may store data corresponding to one logical page LPG. The data corresponding to one logical page LPG may include a number of data bits identical to the number of memory cells included in one physical page PPG. Alternatively, one memory cell may store two or more bits of data. This cell is typically designated as a "multi-level cell: MLC". Here, one physical page PPG may store data corresponding to two or more logical pages LPG.

A memory cell in which two or more bits of data are stored in one memory cell is called a multi-level cell (MLC). However, recently, as the number of data bits stored in one memory cell increases, the multi-level cell (MLC) refers to a memory cell in which two bits of data are stored, and thus a memory cell in which three or more bits of data are stored is called a triple-level cell (TLC) and a memory cell in which four or more bits of data are stored is called a quadruple-level cell (QLC). In addition, a memory cell scheme in which multiple bits of data are stored has been developed, and the present embodiment may be applied to the memory device 100 in which two or more bits of data are stored.

In an embodiment, each of the memory blocks may have a three-dimensional (3D) structure. Each of the memory blocks may include a plurality of memory cells stacked on a substrate. The plurality of memory cells are arranged in +X, +Y, and +Z directions.

FIG. 4 is a diagram illustrating operations performed on memory blocks and operations inhibited from being performed thereon.

Referring to FIGS. 2 and 4, operations that are performed on some memory blocks BLK1 to BLK6, among the plurality of memory blocks BLK1 to BLKz of FIG. 2, and operations that are inhibited from being performed thereon are illustrated in FIG. 4.

In an embodiment, a program operation may be performed on memory cells selected from among the memory cells included in the first memory block BLK1 (PGM). When the program operation is performed on the selected memory cells of the first memory block BLK1, the remaining memory blocks other than the first memory block BLK1 may be inhibited from performing the program operation (INHIBIT). This is illustrated in the first column of FIG. 4.

As illustrated in the second column of FIG. 4, after the program operation has been performed on the first memory block BLK1, a program operation may be performed on memory cells selected from among memory cells included in the second memory block BLK2 (PGM). When the program operation is performed on the selected memory cells of the second memory block BLK2, the remaining memory blocks other than the second memory block BLK2 may be inhibited from performing the program operation (INHIBIT).

As illustrated in the third column of FIG. 4, after the program operation has been performed on the second memory block BLK2, a read operation may be performed on memory cells selected from among the memory cells included in the first memory block BLK1 (READ). When the read operation is performed on the selected memory cells of the first memory block BLK1, the remaining memory blocks other than the first memory block BLK1 may be inhibited from performing a read operation (INHIBIT).

As illustrated in the fourth column of FIG. 4, after the read operation has been performed on the first memory block BLK1, a program operation may be performed on memory cells selected from among memory cells included in the third memory block BLK3 (PGM). When the program operation is performed on the selected memory cells of the third memory block BLK3, the remaining memory blocks other than the third memory block BLK3 may be inhibited from performing a program operation (INHIBIT).

As illustrated in the fifth column of FIG. 4, after the program operation has been performed on the third memory block BLK3, an erase operation may be performed on the first memory block BLK1 (ERASE). When the erase operation is performed on the first memory block BLK1, the remaining memory blocks other than the first memory block BLK1 may be inhibited from performing an erase operation (INHIBIT).

As illustrated in the sixth column of FIG. 4, after the erase operation has been performed on the first memory block BLK1, a read operation may be performed on memory cells selected from among the memory cells included in the third memory block BLK3 (READ). When the read operation is performed on the selected memory cells of the third memory block BLK3, the remaining memory blocks other than the third memory block BLK3 may be inhibited from performing a read operation (INHIBIT).

As described above, in the case where a series of operations are performed on the plurality of memory blocks, when an operation is performed on any one memory block, the corresponding operation might not be performed on the remaining memory blocks. Here, when a certain operation is performed on the memory block or when the memory block is inhibited from performing the certain operation, charges may flow into channels of the memory cells. Therefore, before the read operation is performed, a channel initialization operation may be performed so as to discharge the charges in the channels.

However, because the amounts of charges flowing into channels for respective memory cells are different from each other, there is a need to change the time consumed by the channel initialization operation for each operation that is performed on the corresponding memory block or that is inhibited from being performed thereon. That is, because the time consumed by the read operation may be lengthened due to the time consumed by the channel initialization operation, there is a need to set the channel initialization time differently for respective memory blocks.

Figure 5:
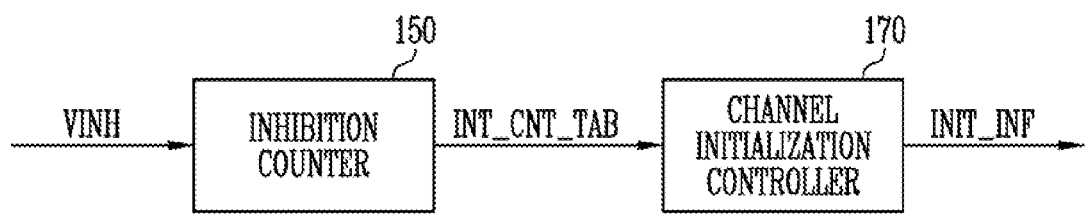
FIG. 5 is a diagram for describing a process for setting a channel initialization time.

FIG. 5 is a diagram for describing a process for setting a channel initialization time.

Referring to FIG. 5, the inhibition counter 150 and the channel initialization controller 170 included in the memory device of FIG. 1 (e.g., 100 of FIG. 1) are illustrated in FIG.

5. FIG. 5 illustrates a process for, when an operation is performed on any one of a plurality of memory blocks included in the memory device (e.g., 100 of FIG. 1), setting a channel initialization time based on the voltages applied to the remaining memory blocks on which the operation is not performed.

In an embodiment, a program operation, a read operation or an erase operation may be performed on any one of the plurality of memory blocks. Here, an inhibition voltage VINH may be applied to the remaining memory blocks, other than the memory block on which the operation is performed, so that the corresponding operation is not performed. Therefore, the inhibition voltage VINH may be any one of a program inhibition voltage which performs control such that the program operation is not performed, a read inhibition voltage which performs control such that the read operation is not performed, and an erase inhibition voltage which performs control such that the erase operation is not performed.

In an embodiment, the inhibition voltage VINH may be a voltage applied to word lines, drain select lines, source select lines, a source line, and/or a bit line which are coupled to each memory block.

For example, when a program operation is performed on any one of the plurality of memory blocks, program inhibition voltages which perform control to prevent the program operation from being performed may be respectively applied to word lines, drain select lines, source select lines, a source line and/or a bit line which are coupled to each of the remaining memory blocks on which the program operation is not performed. When a read operation is performed on any one of the plurality of memory blocks, read inhibition voltages which perform control to prevent the read operation from being performed may be respectively applied to word lines, drain select lines, source select lines, a source line and/or a bit line which are coupled to each of the remaining memory blocks on which the read operation is not performed. Further, when an erase operation is performed on any one of the plurality of memory blocks, erase inhibition voltages which perform control to prevent the erase operation from being performed may be respectively applied to word lines, drain select lines, source select lines, a source line and/or a bit line which are coupled to each of the remaining memory blocks on which the erase operation is not performed.

In an embodiment, the inhibition counter 150 may receive the inhibition voltage VINH. The inhibition voltage VINH may be any one of the program inhibition voltage, the read inhibition voltage, and the erase inhibition voltage.

The inhibition counter 150 may configure an inhibition count table INT_CNT_TAB based on the received inhibition voltage VINH. The inhibition count table INT_CNT_TAB may include results of counting the number of times that an operation is inhibited from being performed on each memory block. For example, the inhibition counter 150 may determine, based on the received inhibition voltage VINH, both a memory block on which the corresponding operation is inhibited from being performed and the type of the inhibited operation, and may increase the number of times (i.e., an inhibition count) that the corresponding operation is inhibited from being performed on the corresponding block.

In an embodiment, the inhibition counter 150 may transmit the inhibition count table INT_CNT_TAB to the channel initialization controller 170 before a read operation is performed.

In an embodiment, the channel initialization controller 170 may generate the channel initialization information INIT_INF based on the inhibition count table INT_CNT_TAB. In detail, the channel initialization controller 170 may determine a final inhibition count value by setting a weight for each inhibition count value included in the inhibition count table INT_CNT_TAB, and may set a channel initialization time corresponding to the final inhibition count value. When the channel initialization time is set, the channel initialization controller 170 may output the channel initialization information INIT_INF including information about the corresponding channel initialization time.

When the channel initialization information INIT_INF is output from the channel initialization controller 170, the memory device (e.g., 100 of FIG. 1) may set a channel initialization time for each memory block based on the channel initialization information INIT_INF before a read operation is performed. When the channel initialization operation is performed based on the set channel initialization time, the read operation may be initiated.

FIGS. 6 to 11 illustrate count values stored in an inhibition count table depending on the operation of FIG. 4.

Referring to FIGS. 6 to 11, an inhibition count table INT_CNT_TAB stored in an inhibition counter (e.g., 150 of FIG. 5) is illustrated in FIGS. 6 to 11. The inhibition count table INT_CNT_TAB may include a program inhibition count value PGM_INH_CNT indicating the number of times that a program operation is inhibited, a read inhibition count value READ_INH_CNT indicating the number of times that a read operation is inhibited, and an erase inhibition count value ERASE_INH_CNT indicating the number of times that an erase operation is inhibited.

Referring to FIGS. 4 and 6, an inhibition count table INT_CNT_TAB that is configured when a program operation is performed on the first memory block BLK1 is illustrated in FIG. 6.

In an embodiment, when the program operation is performed on memory cells selected from among memory cells included in the first memory block BLK1, a program operation may be inhibited from being performed on second to sixth memory blocks BLK2 to BLK6 other than the first memory block BLK1. Whether the program operation is to be inhibited may be determined based on a program inhibition voltage applied to the second to sixth memory blocks BLK2 to BLK6.

In an embodiment, the operation inhibited from being performed on the second to sixth memory blocks BLK2 to BLK6 is the program operation, and thus the program inhibition count value PGM_INH_CNT corresponding to each of the second to sixth memory blocks BLK2 to BLK6 may be incremented by '(+1)' resulting in a count of '1'.

Referring to FIGS. 4 and 7, an inhibition count table INT_CNT_TAB that is configured when a program operation is performed on a second memory block BLK2 after the program operation has been performed on the first memory block BLK1 is illustrated in FIG. 7.

In an embodiment, when the program operation is performed on memory cells selected from among memory cells included in the second memory block BLK2, a program operation may be inhibited from being performed on the first and third to sixth memory blocks BLK1 and BLK3 to BLK6 other than the second memory block BLK2. Whether the program operation is to be inhibited may be determined based on the program inhibition voltage applied to the first and third to sixth memory blocks BLK1 and BLK3 to BLK6.

In an embodiment, the operation inhibited from being performed on the first and third to sixth memory blocks BLK1 and BLK3 to BLK6 is the program operation, and thus the program inhibition count value PGM_INH_CNT corresponding to each of the first and third to sixth memory blocks BLK1 and BLK3 to BLK6 may be incremented by '(+1)'. This results in a count of '1' for the first memory block BLK1 and a count of '2' for each of the third to sixth memory blocks BLK3 to BLK6.

Referring to FIGS. 4 and 8, an inhibition count table INT_CNT_TAB that is configured when a read operation is performed on the first memory block BLK1 after the program operation has been performed on the second memory block BLK2 is illustrated in FIG. 8.

In an embodiment, when the read operation is performed on memory cells selected from among the memory cells included in the first memory block BLK1, a read operation may be inhibited from being performed on the second to sixth memory blocks BLK2 to BLK6 other than the first memory block BLK1. Whether the read operation is to be inhibited may be determined based on a read inhibition voltage applied to the second to sixth memory blocks BLK2 to BLK6.

In an embodiment, the operation inhibited from being performed on the second to sixth memory blocks BLK2 to BLK6 is the read operation, and thus the read inhibition count value READ_INH_CNT corresponding to each of the second to sixth memory blocks BLK2 to BLK6 may be incremented by '(+1)' resulting in a count of '1'.

Referring to FIGS. 4 and 9, an inhibition count table INT_CNT_TAB that is configured when a program operation is performed on the third memory block BLK3 after the read operation has been performed on the first memory block BLK1 is illustrated in FIG. 9.

In an embodiment, when the program operation is performed on memory cells selected from among memory cells included in the third memory block BLK3, a program operation may be inhibited from being performed on the first, second, and fourth to sixth memory blocks BLK1, BLK2, and BLK4 to BLK6 other than the third memory block BLK3. Whether the program operation is to be inhibited may be determined based on the program inhibition voltage applied to the first, second, and fourth to sixth memory blocks BLK1, BLK2, and BLK4 to BLK6.

In an embodiment, the operation inhibited from being performed on the first, second, and fourth to sixth memory blocks BLK1, BLK2 and BLK4 to BLK6 is the program operation, and thus the program inhibition count value PGM_INH_CNT corresponding to each of the first, second, and fourth to sixth memory blocks BLK1, BLK2, and BLK4 to BLK6 may be incremented by '(+1)'. This results in a count of '2' for the first and second memory blocks BLK1 and BLK2, and a count of '3' for each of the fourth to sixth memory blocks BLK4 to BLK6.

Referring to FIGS. 4 and 10, an inhibition count table INT_CNT_TAB that is configured when an erase operation is performed on the first memory block BLK1 after the program operation has been performed on the third memory block BLK3 is illustrated in FIG. 10.

In an embodiment, when the erase operation is performed on the first memory block BLK1, an erase operation may be inhibited from being performed on the second to sixth memory blocks BLK2 to BLK6 other than the first memory block BLK1. Whether the erase operation is to be inhibited may be determined based on an erase inhibition voltage applied to the second to sixth memory blocks BLK2 to BLK6.

In an embodiment, the operation inhibited from being performed on the second to sixth memory blocks BLK2 to BLK6 is the erase operation, and thus the erase inhibition count value ERASE_INH_CNT corresponding to each of the second to sixth memory blocks BLK2 to BLK6 may be incremented by '(+1)' resulting in a count of '1'.

Referring to FIGS. 4 and 11, an inhibition count table INT_CNT_TAB that is configured when a read operation is performed on the third memory block BLK3 after the erase operation has been performed on the first memory block BLK1 is illustrated in FIG. 11.

In an embodiment, when the read operation is performed on memory cells selected from among memory cells included in the third memory block BLK3, a read operation may be inhibited from being performed on the first, second, and fourth to sixth memory blocks BLK1, BLK2, and BLK4 to BLK6 other than the third memory block BLK3. Whether the read operation is to be inhibited may be determined based on the read inhibition voltage applied to the first, second, and fourth to sixth memory blocks BLK1, BLK2, and BLK4 to BLK6.

In an embodiment, the operation inhibited from being performed on the first, second, and fourth to sixth memory blocks BLK1, BLK2, and BLK4 to BLK6 is a read operation, and thus the read inhibition count value READ_INH_CNT corresponding to each of the first, second, and fourth to sixth memory blocks BLK1, BLK2 and BLK4 to BLK6 may be incremented by '(+1)'. This results in a count of '1' for the first memory block BLK1 and a count of '2' for each of the second and fourth to sixth memory blocks BLK2 and BLK4 to BLK6.

When the inhibition count table INT_CNT_TAB is configured through the above-described process, the memory device (e.g., 100 of FIG. 1) may determine a final inhibition count value for which a weight is set based on the inhibition count table INT_CNT_TAB before the read operation is performed. When the final inhibition count value is determined, the memory device (e.g., 100 of FIG. 1) may perform a channel initialization operation during the channel initialization time corresponding to the final inhibition count value, and may perform a read operation after the channel initialization operation.

A method of determining final inhibition count values by setting weights and a method of setting channel initialization times will be described below.

FIGS. 12A and 12B illustrate final inhibition count values, determined based on weights, and channel initialization times.

Referring to FIGS. 12A and 12B, final inhibition count values INH_FI, which are determined depending on different weights based on the inhibition count tables INT_CNT_TAB generated by the inhibition counter (e.g., 150 of FIG. 5), and channel initialization times CINI_TIME, which are set depending on the final inhibition count values INH_FI, are illustrated in FIGS. 12A and 12B. Each of the final inhibition count values INH_FI may be the sum of values, obtained by multiplying respective weights by a program inhibition count value PGM_INH_CNT, a read inhibition count value READ_INH_CNT, and an erase inhibition count value ERASE_INH_CNT. The program inhibition count value PGM_INH_CNT may denote the number of times that a program operation is inhibited from being performed on the corresponding memory block, the read inhibition count value READ_INH_CNT may denote the number of times that a read operation is inhibited from being performed on the corresponding memory block, and the erase inhibition count value ERASE_INH_CNT may denote the number of times that an erase operation is inhibited from being performed on the corresponding memory block. Further, each of the channel initialization times CINI_TIME may be in units of microseconds (µs), and may be a value obtained by dividing a corresponding final inhibition count value INH_FI by a reference value.

In FIGS. 12A and 12B, it is assumed that the reference value by which the final inhibition count value INH_FI is divided is '75'.

In an embodiment, a weight may be set for at least one of the inhibition count values. For example, the weight for at least one of the program inhibition count value PGM_INH_CNT, the read inhibition count value READ_INH_CNT, and the erase inhibition count value ERASE_INH_CNT may be set to '1'. Further, the weights for some inhibition count values may be set in such a way that a weight for the read inhibition count value READ_INH_CNT is set to '0.5' and a weight for the erase inhibition count value ERASE_INH_CNT is set to '0.5'.

In FIG. 12A, it is assumed that the weight for the program inhibition count value PGM_INH_CNT is '0.6', the weight for the read inhibition count value READ_INH_CNT is '0.2', and the weight for the erase inhibition count value ERASE_INH_CNT is '0.2'. Further, in FIG. 12B, it is assumed that the weight for the program inhibition count value PGM_INH_CNT is '0.2', the weight for the read inhibition count value READ_INH_CNT is '0.2', and the weight for the erase inhibition count value ERASE_INH_CNT is '0.6'.

In FIGS. 12A and 12B, for a first memory block BLK1, the program inhibition count value PGM_INH_CNT may be '300', the read inhibition count value READ_INH_CNT may be '300', and the erase inhibition count value ERASE_INH_CNT may be '50'. For a second memory block BLK2, the program inhibition count value PGM_INH_CNT may be '200', the read inhibition count value READ_INH_CNT may be '200', and the erase inhibition count value ERASE_INH_CNT may be '100'. For a third memory block BLK3, the program inhibition count value PGM_INH_CNT may be '300', the read inhibition count value READ_INH_CNT may be '100', and the erase inhibition count value ERASE_INH_CNT may be '1000'. For a fourth memory block BLK4, the program inhibition count value PGM_INH_CNT may be '500', the read inhibition count value READ_INH_CNT may be '500', and the erase inhibition count value ERASE_INH_CNT may be '10'. Further, for a fifth memory block BLK5, the program inhibition count value PGM_INH_CNT may be '1000', the read inhibition count value READ_INH_CNT may be '1000', and the erase inhibition count value ERASE_INH_CNT may be '30'. Furthermore, for a sixth memory block BLK6, the program inhibition count value PGM_INH_CNT may be '400', the read inhibition count value READ_INH_CNT may be '300', and the erase inhibition count value ERASE_INH_CNT may be '100'.

Referring to FIG. 12A, the final inhibition count value for the first memory block BLK1 may be '250'. In detail, the final inhibition count value INH_FI calculated by summing a value, which is obtained by multiplying a weight of 0.6 by the program inhibition count value PGM_INH_CNT for the first memory block BLK1, a value, which is obtained by multiplying a weight of 0.2 by the read inhibition count value READ_INH_CNT for the first memory block BLK1, and a value, which is obtained by multiplying a weight of 0.2 by the erase inhibition count value ERASE_INH_CNT for the first memory block BLK1, may be '250'.

As described above, when the final inhibition count values INH_FI for respective memory blocks are calculated, the final inhibition count value INH_FI for the second memory block BLK2 may be '180', the final inhibition count value INH_FI for the third memory block BLK3 may be '400', the final inhibition count value INH_FI for the fourth memory block BLK4 may be '402', the final inhibition count value INH_FI for the fifth memory block BLK5 may be '806', and the final inhibition count value INH_FI for the sixth memory block BLK6 may be '320'.

In an embodiment, each channel initialization time CINI_TIME may be set depending on the corresponding final inhibition count value INH_FI. Therefore, the channel initialization time CINI_TIME for the first memory block BLK1 may be 3.33 µs obtained by dividing the final inhibition count value INH_FI by the reference value, which in the present example is 75. The channel initialization time CINI_TIME for the second memory block BLK2 may be 2.4 µs obtained by dividing the final inhibition count value INH_FI by the reference value. The channel initialization time CINI_TIME for the third memory block BLK3 may be 5.33 µs is obtained by dividing the final inhibition count value INH_FI by the reference value. The channel initialization time CINI_TIME for the fourth memory block BLK4 may be 5.36 µs obtained by dividing the final inhibition count value INH_FI by the reference value. The channel initialization time CINI_TIME for the fifth memory block BLK5 may be 10.74 µs obtained by dividing the final inhibition count value INH_FI by the reference value. The channel initialization time CINI_TIME for the sixth memory block BLK6 may be 4.27 µs obtained by dividing the final inhibition count value INH_FI by the reference value.

Referring to FIG. 12B, the final inhibition count value for the first memory block BLK1 may be '150'. In detail, the final inhibition count value INH_FI calculated by summing a value, which is obtained by multiplying a weight of 0.2 by the program inhibition count value PGM_INH_CNT for the first memory block BLK1, a value, which is obtained by multiplying a weight of 0.2 by the read inhibition count value READ_INH_CNT for the first memory block BLK1, and a value, which is obtained by multiplying a weight of 0.6 by the erase inhibition count value ERASE_INH_CNT for the first memory block BLK1, may be '150'.

As described above, when the final inhibition count values INH_FI for respective memory blocks are calculated, the final inhibition count value INH_FI for the second memory block BLK2 may be '140', the final inhibition count value INH_FI for the third memory block BLK3 may be '680', the final inhibition count value INH_FI for the fourth memory block BLK4 may be '206', the final inhibition count value INH_FI for the fifth memory block BLK5 may be '418', and the final inhibition count value INH_FI for the sixth memory block BLK6 may be '200'.

In an embodiment, each channel initialization time CINI_TIME may be set depending on the corresponding final inhibition count value INH_FI. Therefore, the channel initialization time CINI_TIME for the first memory block BLK1 may be 2 µs obtained by dividing the final inhibition count value INH_FI by the reference value, which in the present example is 75. The channel initialization time CINI_TIME for the second memory block BLK2 may be 1.87 µs obtained by dividing the final inhibition count value INH_FI by the reference value. The channel initialization time CINI_TIME for the third memory block BLK3 may be 9.07 µs obtained by dividing the final inhibition count value INH_FI by the reference value. The channel initialization time CINI_TIME for the fourth memory block BLK4 may be 2.74 µs obtained by dividing the final inhibition count value INH_FI by the reference value. The channel initialization time CINI_TIME for the fifth memory block BLK5 may be 5.73 µs obtained by dividing the final inhibition count value INH_FI by the reference value. The channel initialization time CINI_TIME for the sixth memory block BLK6 may be 2.67 μs obtained by dividing the final inhibition count value INH_FI by the reference value.

As a result, the final inhibition count value INH_FI for one memory block may change depending on a weight for each inhibition count value, and thus the channel initialization time CINI_TIME may also change.

In an embodiment, when the channel initialization time CINI_TIME is set, the memory device (e.g., 100 of FIG. 1) may perform a read operation after performing a channel initialization operation during the corresponding channel initialization time CINI_TIME set for each memory block before the read operation.

FIG. 13 is a flowchart illustrating the operation of a memory device according to an embodiment of the present disclosure.

Referring to FIG. 13, at step S1301, the memory device may receive a command from the memory controller. For example, the memory device may receive a program command, a read command or an erase command from the memory controller.

At step S1303, the memory device may determine whether the command received from the memory controller is a read command.

In an embodiment, when it is determined that the command received from the memory controller is the read command (in the case of Y), the process may proceed to step S1305.

At step S1305, before a read operation corresponding to the read command is performed, the memory device may set a channel initialization time for each memory block, and may thereafter perform a channel initialization operation during the determined time. After the channel initialization operation has been completed, the read operation may be performed.

In detail, the channel initialization time may be a time corresponding to a value obtained by dividing a final inhibition count value for each memory block by a reference value. Here, the final inhibition count value may be the sum of values obtained by multiplying respective weights by corresponding inhibition count values. For example, the final inhibition count value for any one memory block may be calculated as the total sum of a value, which is obtained by multiplying a weight by a program inhibition count value for the corresponding memory block, a value, which is obtained by multiplying a weight by a read inhibition count value for the memory block, and a value, which is obtained by multiplying a weight by an erase inhibition count value for the memory block.

In an embodiment, when the command received from the memory controller is not a read command (in the case of N), that is, when the command received from the memory controller is a program command or an erase command, the process may proceed to step S1307.

At step S1307, the memory device may perform an operation corresponding to the command received from the memory controller. Therefore, the memory device may perform a program operation corresponding to the program command or an erase operation corresponding to the erase command.

At step S1309, the memory device may increase the inhibition count value for each of the remaining memory blocks other than the memory block on which the corresponding operation is performed. For example, when a program operation is performed on any one of the plurality of memory blocks, the memory device may increase the program inhibition count value corresponding to each of the remaining memory blocks. When a read operation is performed on any one of the plurality of memory blocks, the memory device may increase the read inhibition count value corresponding to each of the remaining memory blocks. When an erase operation is performed on any one of the plurality of memory blocks, the memory device may increase the erase inhibition count value corresponding to each of the remaining memory blocks.

Figure 14:
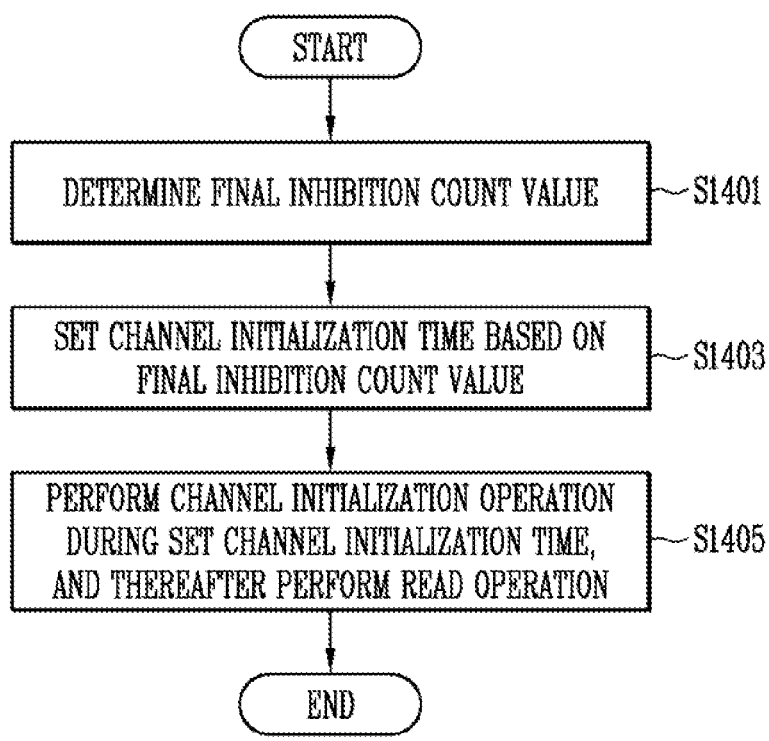
FIG. 14 is a flowchart illustrating the operation of a memory device according to an embodiment of the present disclosure.

FIG. 14 is a flowchart illustrating the operation of a memory device according to an embodiment of the present disclosure.

Referring to FIGS. 13 and 14, detailed steps obtained by subdividing step S1305 of FIG. 13 are illustrated in FIG. 14.

At step S1401, the memory device may determine the final inhibition count value. The final inhibition count value may be the sum of values obtained by multiplying respective weights by corresponding inhibition count values, and each inhibition count value may be a value obtained by counting the number of times that an operation is inhibited from being performed on each of the remaining memory blocks on which the operation is not performed when the operation is performed on any one memory block. For example, the program inhibition count value may be a value obtained by counting the number of times that a program operation is not performed on a corresponding memory block, the read inhibition count value may be a value obtained by counting the number of times that a read operation is not performed on the corresponding memory block, and the erase inhibition count value may be a value obtained by counting the number of times that an erase operation is not performed on the corresponding memory block.

Therefore, the final inhibition count value may be calculated as the total sum of a value, which is obtained by multiplying a weight by the program inhibition count value for any one memory block, a value, which is obtained by multiplying a weight by the read inhibition count value for the memory block, and a value, which is obtained by multiplying a weight by the erase inhibition count value for the memory block.

At step S1403, the memory device may set a channel initialization time based on the final inhibition count value. Here, the channel initialization time may be a time corresponding to a value obtained by dividing the final inhibition count value by the reference value.

At step S1405, the memory device may perform a channel initialization operation during the channel initialization time set for each memory block, and may thereafter perform a read operation. Therefore, the channel initialization time may be set for each memory block, and thus time consumed by the read operation may be shortened.

Figure 15:
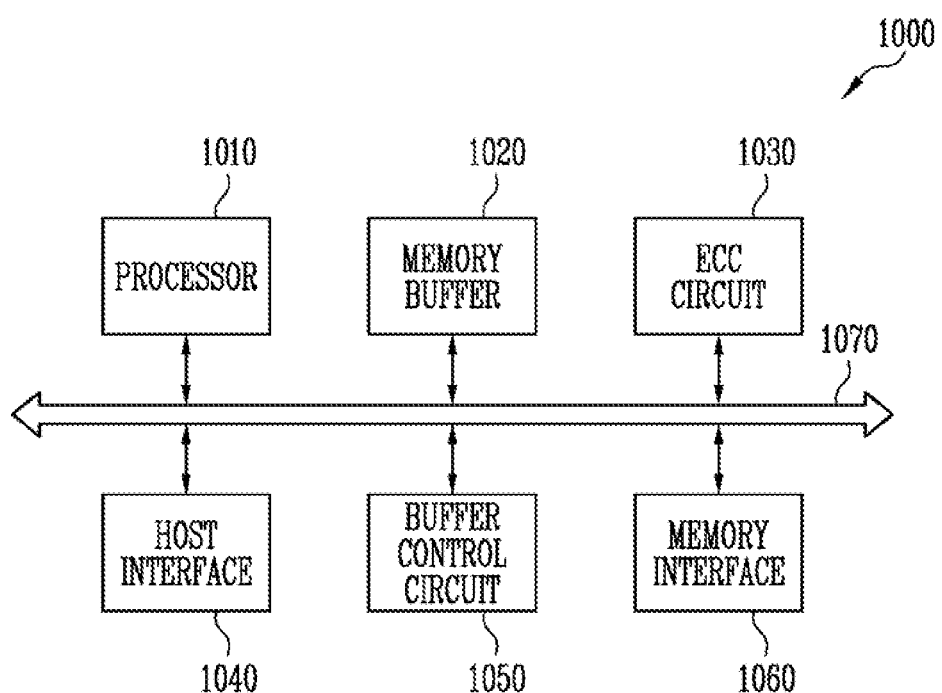
FIG. 15 is a diagram illustrating an embodiment of a memory controller of FIG. 1.

FIG. 15 is a diagram illustrating an embodiment of the memory controller of FIG. 1.

A memory controller 1000 is coupled to a host and a memory device. In response to a request received from the host, the memory controller 1000 may access the memory device. For example, the memory controller 1000 may be configured to control write, read, erase, and background operations of the memory device. The memory controller 1000 may provide an interface between the memory device and the host. The memory controller 1000 may run firmware for controlling the memory device.

Referring to FIG. 15, the memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may provide channels between components of the memory controller 1000.

The processor 1010 may control the overall operation of the memory controller 1000 and may perform a logical operation. The processor 1010 may communicate with an external host through the host interface 1040 and also communicate with the memory device through the memory interface 1060. Further, the processor 1010 may communicate with the memory buffer 1020 through the buffer control circuit 1050. The processor 1010 may control the operation of the storage device by using the memory buffer 1020 as working memory, cache memory or buffer memory.

The processor 1010 may perform the function of a flash translation layer (FTL). The processor 1010 may translate a logical block address (LBA), provided by the host, into a physical block address (PBA) through the FTL. The FTL may receive the LBA using a mapping table and translate the LBA into the PBA. Examples of an address mapping method performed through the FTL may include various methods according to a mapping unit. Representative address mapping methods include a page mapping method, a block mapping method, and a hybrid mapping method.

The processor 1010 may randomize data received from the host. For example, the processor 1010 may use a randomizing seed to randomize data received from the host. The randomized data may be provided, as data to be stored, to the memory device and may be programmed in the memory cell array.

The processor 1010 may run software or firmware to perform the randomizing or derandomizing operation.

In an embodiment, the processor 1010 may run software or firmware to perform randomizing and derandomizing operations.

The memory buffer 1020 may be used as working memory, cache memory, or buffer memory of the processor 1010. The memory buffer 1020 may store codes and commands executed by the processor 1010. The memory buffer 1020 may store data that is processed by the processor 1010. The memory buffer 1020 may include static RAM (SRAM) or dynamic RAM (DRAM).

The ECC circuit 1030 may perform error correction. The ECC circuit 1030 may perform error correction code (ECC) encoding based on data to be written to the memory device through the memory interface 1060. The ECC-encoded data may be transferred to the memory device through the memory interface 1060. The ECC circuit 1030 may perform ECC decoding based on data received from the memory device through the memory interface 1060. In an example, the ECC circuit 1030 may be included as the component of the memory interface 1060 in the memory interface 1060.

The host interface 1040 may communicate with the external host under the control of the processor 1010. The host interface 1040 may perform communication using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The buffer control circuit 1050 may control the memory buffer 1020 under the control of the processor 1010.

The memory interface 1060 may communicate with the memory device under the control of the processor 1010. The memory interface 1060 may transmit/receive commands, addresses, and data to/from the memory device through channels.

In an embodiment, the memory controller 1000 might not include the memory buffer 1020 and the buffer control circuit 1050.

In an embodiment, the processor 1010 may control the operation of the memory controller 1000 using codes. The processor 1010 may load codes from a nonvolatile memory device (e.g., ROM) provided in the memory controller 1000. In an embodiment, the processor 1010 may load codes from the memory device through the memory interface 1060.

In an embodiment, the bus 1070 of the memory controller 1000 may be divided into a control bus and a data bus. The data bus may be configured to transmit data in the memory controller 1000, and the control bus may be configured to transmit control information such as commands or addresses in the memory controller 1000. The data bus and the control bus may be isolated from each other, and may neither interfere with each other nor influence each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 16:
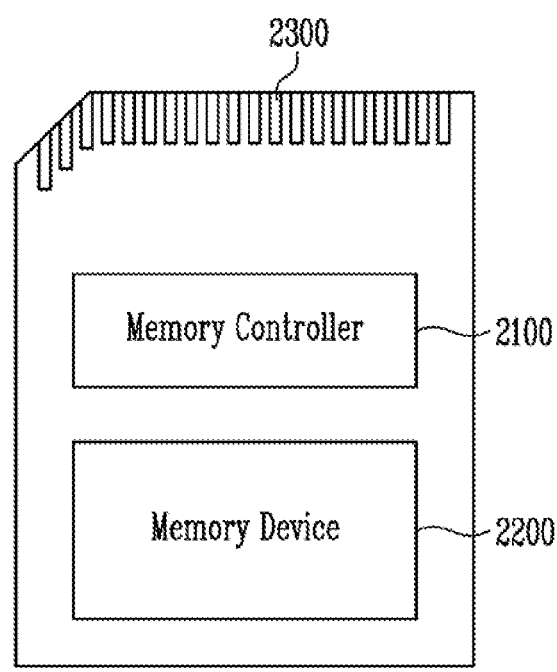
FIG. 16 is a block diagram illustrating a memory card system to which a storage device according to an embodiment of the present disclosure is applied.

FIG. 16 is a block diagram illustrating a memory card system to which the storage device according to an embodiment of the present disclosure is applied.

Referring to FIG. 16, a memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may control read, write, erase, and background operations of the memory device 2200. The memory controller 2100 may provide an interface between the memory device 2200 and a host. The memory controller 2100 may run firmware for controlling the memory device 2200. The memory device 2200 may be implemented in the same way as the memory device (e.g., 100 of FIG. 1) described above with reference to FIG. 1.

In an embodiment, the memory controller 2100 may include components, such as RAM, a processor, a host interface, a memory interface, and an ECC circuit.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols such as universal serial bus (USB), multi-media card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices including, for example, Electrically Erasable and Programmable ROM (EEPROM), NAND flash memory, NOR flash memory, Phase-change RAM (PRAM), Resistive RAM (ReRAM), Ferroelectric RAM (FRAM), Spin-Transfer Torque Magnetic RAM (STT-MRAM).

The memory controller 2100 and the memory device 2200 may be integrated into a single semiconductor device to configure a memory card. For example, the memory controller 2100 and the memory device 2200 may be integrated into a single semiconductor device to configure a memory card such as a PC card (personal computer memory card international association: PCMCIA), a compact flash card (CF), a smart media card (SM or SMC), a memory stick, a multimedia card (MMC, RS-MMC, MMCmicro or eMMC), a SD card (SD, miniSD, microSD, or SDHC), or a universal flash storage (UFS).

In an embodiment, the memory device 2200 may set a channel initialization time based on a final inhibition count value and perform a channel initialization operation during the set channel initialization time before a read operation is performed. Here, the channel initialization time may be set differently for respective memory blocks. Therefore, the final inhibition count value may be calculated as the total sum of a value, which is obtained by multiplying a weight by a program inhibition count value for the corresponding memory block, a value, which is obtained by multiplying a weight by a read inhibition count value for the memory block, and a value, which is obtained by multiplying a weight by an erase inhibition count value for the memory block. Here, the program inhibition count value may be a value obtained by counting the number of times that a program operation is inhibited from being performed on the memory block, the read inhibition count value may be a value obtained by counting the number of times that a read operation is inhibited from being performed on the memory block, and the erase inhibition count value may be a value obtained by counting the number of times that an erase operation is inhibited from being performed on the memory block.

In an embodiment, the memory device 2200 may shorten the time consumed by the read operation by setting the channel initialization time differently for respective memory blocks. That is, when a read operation is performed on memory cells selected from among memory cells included in each memory block, the channel initialization operations are performed during channel initialization times that are set differently for respective memory blocks, thus shortening the time consumed by the read operation. Because time consumed by the read operation may be shortened, read performance may be improved.

Figure 17:
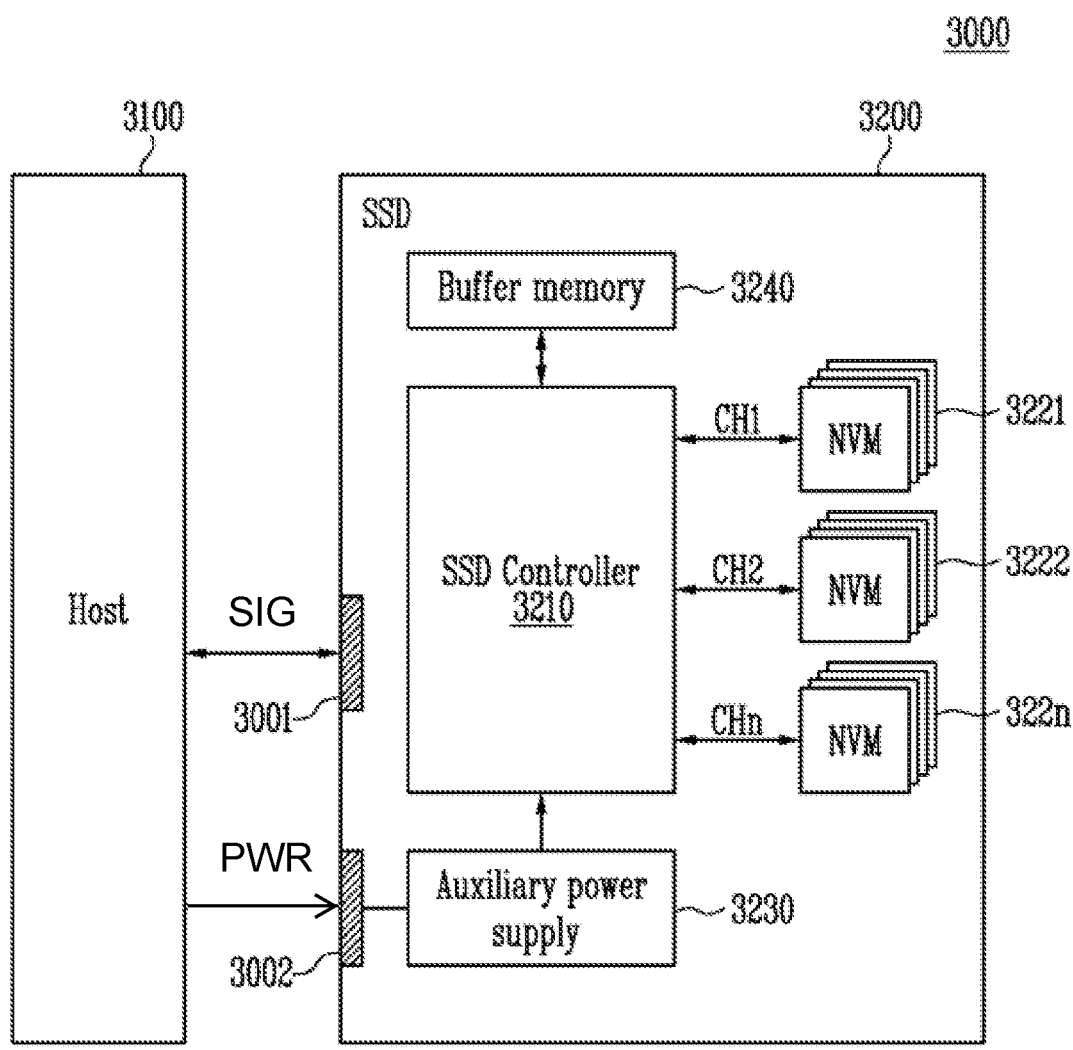
FIG. 17 is a block diagram illustrating an example of a solid state drive (SSD) system to which a storage device according to an embodiment of the present disclosure is applied.

FIG. 17 is a block diagram illustrating a solid state drive (SSD) system to which a storage device according to an embodiment of the present disclosure is applied.

Referring to FIG. 17, an SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller (e.g., 200 of FIG. 1) described above with reference to FIG. 1.

The SSD controller 3210 may control the plurality of flash memories 3221 to 322n in response to the signals SIG received from the host 3100. In an embodiment, the signals SIG may be signals based on the interfaces of the host 3100 and the SSD 3200. For example, the signals SIG may be signals defined by at least one of various interfaces such as universal serial bus (USB), multi-media card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100 and may be charged. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata (e.g., mapping tables) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

In an embodiment, each of the plurality of flash memories 3221 to 322n may set a channel initialization time based on a final inhibition count value and perform a channel initialization operation during the set channel initialization time before a read operation is performed. Here, the channel initialization time may be set differently for respective memory blocks. Therefore, the final inhibition count value may be calculated as the total sum of a value, which is obtained by multiplying a weight by a program inhibition count value for the corresponding memory block, a value, which is obtained by multiplying a weight by a read inhibition count value for the memory block, and a value, which is obtained by multiplying a weight by an erase inhibition count value for the memory block. Here, the program inhibition count value may be a value obtained by counting the number of times that a program operation is inhibited from being performed on the memory block, the read inhibition count value may be a value obtained by counting the number of times that a read operation is inhibited from being performed on the memory block, and the erase inhibition count value may be a value obtained by counting the number of times that an erase operation is inhibited from being performed on the memory block.

In an embodiment, the plurality of flash memories 3221 to 322n may reduce the time consumed by the read operation by differently setting the channel initialization time for respective memory blocks. That is, when a read operation is performed on memory cells selected from among memory cells included in each memory block, the channel initialization operations are performed during channel initialization times that are set differently for respective memory blocks, thus shortening the time consumed by the read operation. Because the time consumed by the read operation may be shortened, read performance may be improved.

Figure 18:
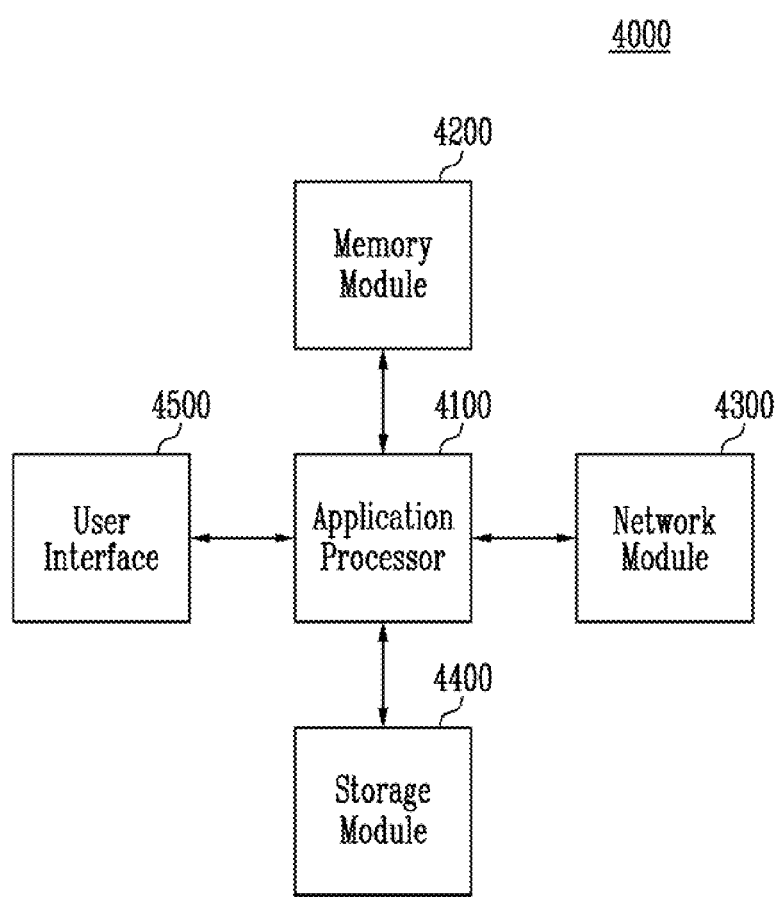
FIG. 18 is a block diagram illustrating a user system to which a storage device according to an embodiment of the present disclosure is applied.

FIG. 18 is a block diagram illustrating a user system to which the storage device according to an embodiment of the present disclosure is applied.

Referring to FIG. 18, a user system 4000 may include an application processor 4100, a memory module 4200, a network module 4300, a storage module 4400, and a user interface 4500.

The application processor 4100 may run components included in the user system 4000, an Operating System (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as main memory, working memory, buffer memory or cache memory of the user system 4000. The memory module 4200 may include volatile RAM such as DRAM, SDRAM, DDR SDRAM, DDR2 SDRAM, DDR3 SDRAM, LPDDR SDRAM, LPDDR2 SDRAM, and LPDDR3 SDRAM, or nonvolatile RAM such as PRAM, ReRAM, MRAM, and FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), WiMAX, WLAN, UWB, Bluetooth, or Wi-Fi communication. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device including, for example, Phase-change RAM (PRAM), Magnetic RAM (MRAM), Resistive RAM (RRAM), NAND flash memory, NOR flash memory, or NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, each of which may be operated in the same way as the memory device described above with reference to FIGS. 2 and 3. The storage module 4400 may be operated in the same way as the storage device 50 described above with reference to FIG. 1.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a monitor.

In an embodiment, the storage module 4400 may set a channel initialization time based on a final inhibition count value and perform a channel initialization operation during the set channel initialization time before a read operation is performed. Here, the channel initialization times may be set differently for respective memory blocks. Therefore, the final inhibition count value may be calculated as the total sum of a value, which is obtained by multiplying a weight by a program inhibition count value for the corresponding memory block, a value, which is obtained by multiplying a weight by a read inhibition count value for the memory block, and a value, which is obtained by multiplying a weight by an erase inhibition count value for the memory block. Here, the program inhibition count value may be a value obtained by counting the number of times that a program operation is inhibited from being performed on the memory block, the read inhibition count value may be a value obtained by counting the number of times that a read operation is inhibited from being performed on the memory block, and the erase inhibition count value may be a value obtained by counting the number of times that an erase operation is inhibited from being performed on the memory block.

In an embodiment, the storage module 4400 may shorten the time consumed by the read operation by setting the channel initialization time differently for respective memory blocks. That is, when a read operation is performed on memory cells selected from among memory cells included in each memory block, the channel initialization operations are performed during channel initialization times that are set differently for respective memory blocks, thus shortening the time consumed by the read operation. Because the time consumed by the read operation may be shortened, read performance may be improved.

In accordance with an embodiment of the present disclosure, the number of times that a corresponding operation is inhibited from being performed on each memory block is counted, and a channel initialization time is set by assigning a weight to a counted number, and thus read performance may be improved.

What is claimed is:

1. A memory device, comprising:
a plurality of memory blocks each including a plurality of memory cells;
a peripheral circuit configured to perform a program operation, a read operation and an erase operation on the plurality of memory blocks; and
control logic configured to, when the read operation is performed on any one of the plurality of memory blocks:
set a channel initialization time used to initialize channels of memory cells included in the one memory block based on an inhibition count value indicating a number of times that at least one of the program operation, the read operation, and the erase operation for the one memory block is inhibited; and
control the peripheral circuit to initialize the channels during the channel initialization time before the read operation is performed.

2. The memory device according to claim 1, wherein the inhibition count value is any one of:
a program inhibition count value indicating a number of times that the program operation is inhibited;
a read inhibition count value indicating a number of times that the read operation is inhibited; and
an erase inhibition count value indicating a number of times that the erase operation is inhibited.

3. The memory device according to claim 2, wherein the control logic is configured to:
when the program operation is performed on remaining memory blocks other than the one memory block, among the plurality of memory blocks, increase the program inhibition count value;

when the read operation is performed on the remaining memory blocks other than the one memory block, among the plurality of memory blocks, increase the read inhibition count value; and when the erase operation is performed on the remaining memory blocks other than the one memory block, among the plurality of memory blocks, increase the erase inhibition count value.

4. The memory device according to claim 2,
wherein the control logic is configured to determine a final inhibition count value as a sum of values obtained by multiplying respective weights by one or more of the program inhibition count value, the read inhibition count value, and the erase inhibition count value.

5. The memory device according to claim 4,
wherein the control logic is configured to set the respective weights to at least two or less values or to different values for the program inhibition count value, the read inhibition count value, and the erase inhibition count value.

6. The memory device according to claim 4,
wherein the control logic is configured to set the channel initialization time to a value determined by dividing the final inhibition count value by a reference value.

7. The memory device according to claim 1, wherein the control logic comprises:
an inhibition counter configured to count the number of times that the at least one of the program operation, the read operation, and the erase operation is inhibited from being performed on the one memory block and to generate an inhibition count table used to determine the inhibition count value; and
a channel initialization controller configured to set the channel initialization time based on the inhibition count table.

8. The memory device according to claim 7,
wherein the inhibition counter is configured to count the number of times that the at least one of the program operation, the read operation, and the erase operation is inhibited from being performed on the one memory block based on an inhibition voltage that is applied to inhibit the at least one of the program operation, the read operation, and the erase operation from being performed on the one memory block.

9. The memory device according to claim 7, wherein the inhibition counter is configured to:
when the program operation is performed on remaining memory blocks other than the one memory block, among the plurality of memory blocks, increase a program inhibition count value corresponding to the one memory block in the inhibition count table;
when the read operation is performed on the remaining memory blocks other than the one memory block, among the plurality of memory blocks, increase a read inhibition count value corresponding to the one memory block in the inhibition count table; and
when the erase operation is performed on the remaining memory blocks other than the one memory block, among the plurality of memory blocks, increase an erase inhibition count value corresponding to the one memory block in the inhibition count table.

10. The memory device according to claim 9,
wherein the channel initialization controller is configured to determine a final inhibition count value as a sum of values, obtained by multiplying respective weights by one or more of the program inhibition count value, the read inhibition count value, and the erase inhibition count value that are included in the inhibition count table received from the inhibition counter.

11. The memory device according to claim 10,
wherein the channel initialization controller is configured to set the respective weights to at least two or less values or to different values for the program inhibition count value, the read inhibition count value, and the erase inhibition count value.

12. The memory device according to claim 10,
wherein the channel initialization controller is configured to set the channel initialization time to a value determined by dividing the final inhibition count value by a reference value.

13. The memory device according to claim 12,
wherein the channel initialization controller is configured to generate channel initialization information including information about the set channel initialization time, and
wherein the peripheral circuit is configured to initialize the channels of the memory cells included in the one memory block during the set channel initialization time based on the channel initialization information output from the channel initialization controller.

14. A method of operating a memory device, the memory device including a plurality of memory blocks each including a plurality of memory cells, the method comprising:
before a read operation is performed on any one of the plurality of memory blocks, counting a number of times that a corresponding operation is inhibited from being performed on the one memory block and then generating an inhibition count value;
determining a final inhibition count value based on the inhibition count value;
setting a channel initialization time used to initialize channels of memory cells included in the one memory block based on the final inhibition count value; and
initializing the channels during the channel initialization time, and thereafter performing the read operation.

15. The method according to claim 14,
wherein generating the inhibition count value comprises generating the inhibition count value based on an inhibition voltage that is applied to inhibit the corresponding operation from being performed on the one memory block.

16. The method according to claim 14, wherein the inhibition count value is any one of:
a program inhibition count value indicating a number of times that a program operation is inhibited;
a read inhibition count value indicating a number of times that the read operation is inhibited; and
an erase inhibition count value indicating a number of times that an erase operation is inhibited.

17. The method according to claim 16, wherein generating the inhibition count value comprises:
when the program operation is performed on remaining memory blocks other than the one memory block, among the plurality of memory blocks, increasing the program inhibition count value;
when the read operation is performed on the remaining memory blocks other than the one memory block, among the plurality of memory blocks, increasing the read inhibition count value; and
when the erase operation is performed on the remaining memory blocks other than the one memory block, among the plurality of memory blocks, increasing the erase inhibition count value.

18. The method according to claim 16,
wherein determining the final inhibition count value comprises determining a final inhibition count value as a sum of values obtained by multiplying respective weights by one or more of the program inhibition count value, the read inhibition count value, and the erase inhibition count value.

19. The method according to claim 18,
wherein determining the final inhibition count value comprises setting the respective weights to at least two or less value or to different values for the program inhibition count value, the read inhibition count value, and the erase inhibition count value.

20. The method according to claim 18,
wherein setting the channel initialization time comprises setting the channel initialization time to a value determined by dividing the final inhibition count value by a reference value.

\* \* \* \* \*